US 6,236,567 B1

(12) United States Patent
Chen

(10) Patent No.: US 6,236,567 B1
(45) Date of Patent: May 22, 2001

(54) ELECTRONIC DEVICE PACKAGE WITH ENHANCED HEAT DISSIPATION EFFECT

(75) Inventor: Shih-Li Chen, Hsinchu (TW)

(73) Assignee: Caesar Technology Inc., Hsinchu (TW)

( * ) Notice: Subject to any disclaimer, the term of this patent is extended or adjusted under 35 U.S.C. 154(b) by 0 days.

(21) Appl. No.: 09/453,301

(22) Filed: Dec. 3, 1999

(51) Int. Cl.[7] .................................................. H05K 7/20
(52) U.S. Cl. ................ 361/704; 174/16.3; 174/52.4; 257/713; 257/675; 361/718; 361/723
(58) Field of Search ..................... 165/80.2; 174/16.3, 174/52.2, 52.4; 257/706, 707, 712, 713, 675; 361/704, 707, 717–718, 722, 723

(56) References Cited

U.S. PATENT DOCUMENTS

| | | | |
|---|---|---|---|
| 5,305,179 | * 4/1994 | Sono et al. | 361/718 |
| 5,420,751 | * 5/1995 | Burns | 361/707 |
| 5,442,233 | * 8/1995 | Anjoh et al. | 257/675 |
| 5,828,000 | * 10/1999 | Sano | 257/675 |
| 6,078,502 | * 6/2000 | Rostoker et al. | 361/723 |

* cited by examiner

Primary Examiner—Gregory Thompson
(74) Attorney, Agent, or Firm—Rosenberg, Klein & Lee

(57) ABSTRACT

An electronic device package with enhanced heat dissipation effect comprises a lead frame and an outer frame with electrically insulating surface. The outer frame encloses the electronic device with a predetermined gap therebetween. The lead frame has a plurality of inner leads extending to the upper surface of the electronic device and a plurality of outer leads enclosing the outer surface of the outer frame. Each inner lead and each outer lead are linked by a slanting portion. The plurality of outer leads includes at least one ground outer lead with larger cross section area than other outer leads. Therefore, the heat generated by the electronic device can be conducted outside through the ground outer lead when the ground outer lead is connected to other device.

9 Claims, 5 Drawing Sheets

ELECTRONIC DEVICE PACKAGE WITH ENHANCED HEAT DISSIPATION EFFECT

FIELD OF THE INVENTION

The present invention relates to an electronic device package, especially to a chip scale package (CSP) for IC chip.

BACKGROUND OF THE INVENTION

The electronic device should be provided with suitable heat dissipation means to removed heat generated within the electronic device and prevent the damage caused by overheating. The problem of heat dissipation becomes a performance-limiting factor of the electronic device as the electronic device becomes more powerful and generate more heat.

The high-density and high performance microelectronic device generate heat with higher density, therefore, the problem of heat dissipation becomes more involved. The package for high-density and high performance microelectronic device should be carefully designed to meet the requirement.

The package of electronic device play an important role to facilitate heat dissipation of the electronic device. More particular, the gradually-prevailing chip scale package (CSP) for IC chip provides a small package with size comparable to that of semiconductor chip. However, the heat density is extreme high due to the small package size, the heat dissipation thereof is difficult to packaging designer.

Moreover, the idea of using substrate as heat spreader of chip to enhance heat dissipation effect is proposed for ball grid array package (BGA package).

It is an object of the invention to provide an electronic device package with enhanced heat dissipation effect.

To achieve the above object, the present invention provides an electronic device package with enhanced heat dissipation effect and comprising a lead frame and an outer frame with electrically insulating surface. The outer frame encloses the electronic device with a predetermined gap therebetween. The lead frame has a plurality of inner leads extending to the upper surface of the electronic device and a plurality of outer leads enclosing the outer surface of the outer frame. Each inner lead and each outer lead are linked by a slanting portion. The plurality of outer leads includes at least one ground outer lead with larger cross section area than other outer leads. Therefore, the heat generated by the electronic device can be conducted outside through the ground outer lead when the ground outer lead is connected to other device.

The various objects and advantages of the present invention will be more readily understood from the following detailed description when read in conjunction with the appended drawing, in which:

DETAILED DESCRIPTION OF THE PREFERRED EMBODIMENTS

Figure 1:
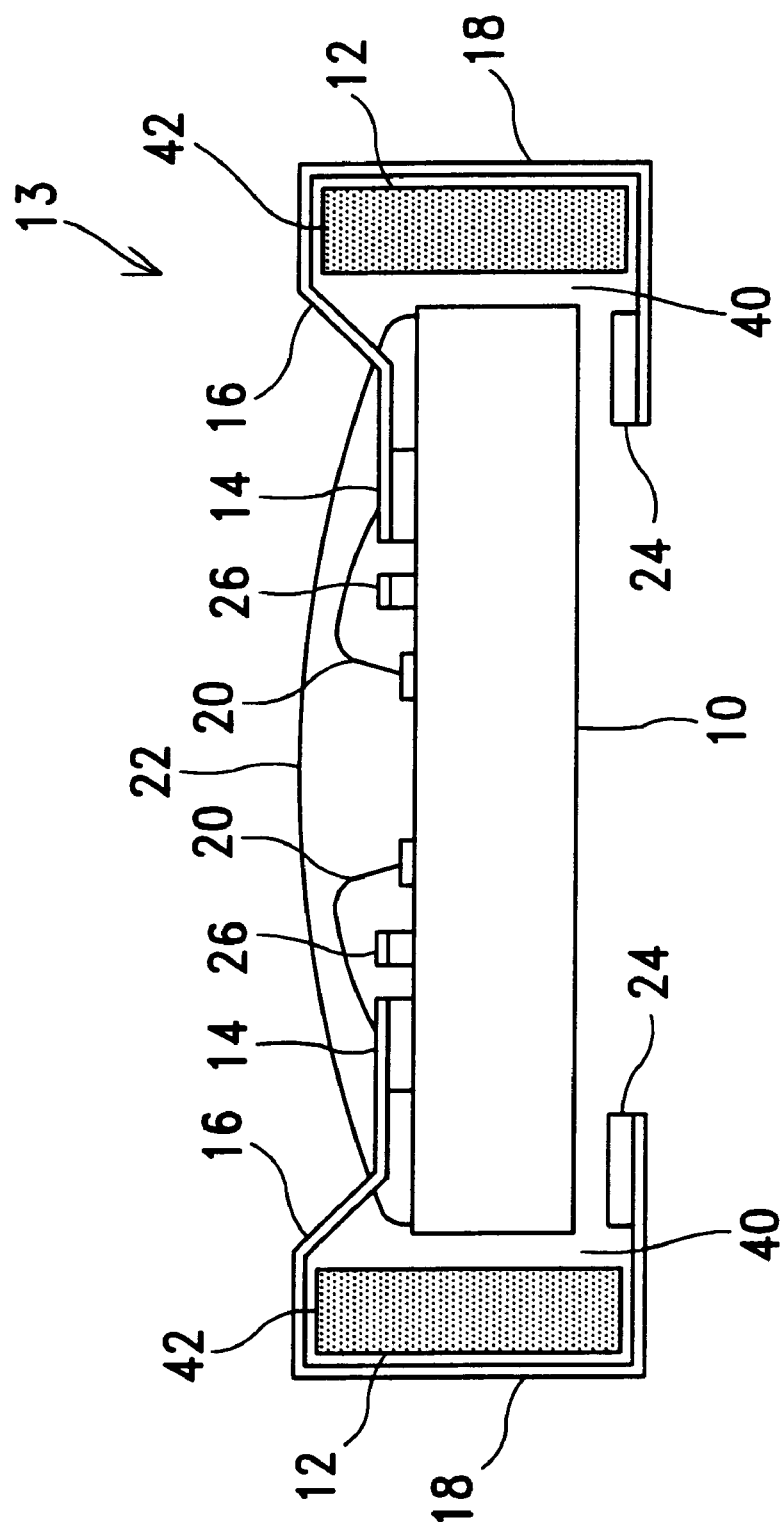
FIG. 1 is the cross section view of the electronic device package according to the present invention.
Figure 2:
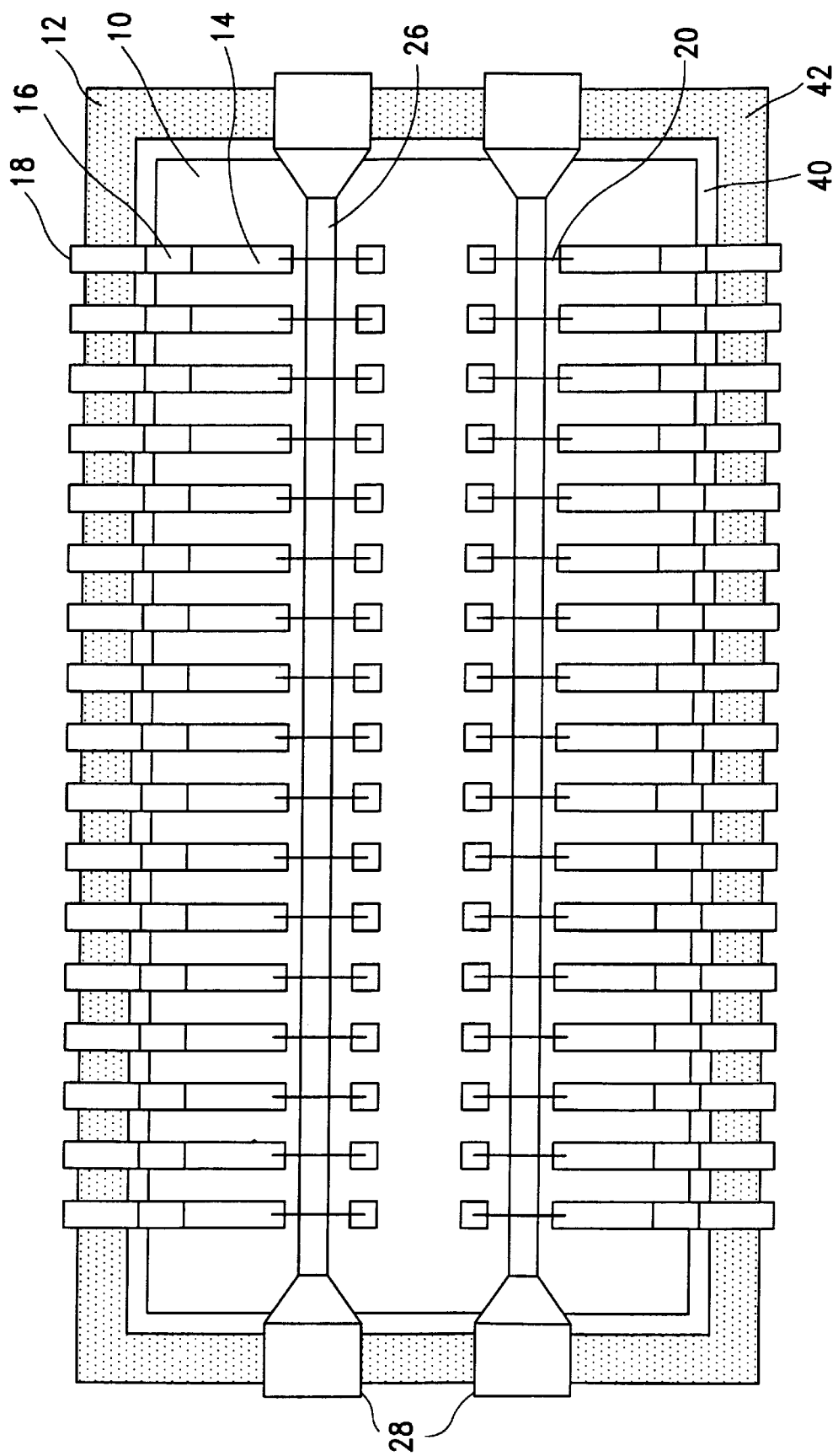
FIG. 2 is the top view of the electronic device package according to a first preferred embodiment of the present invention.
Figure 3:
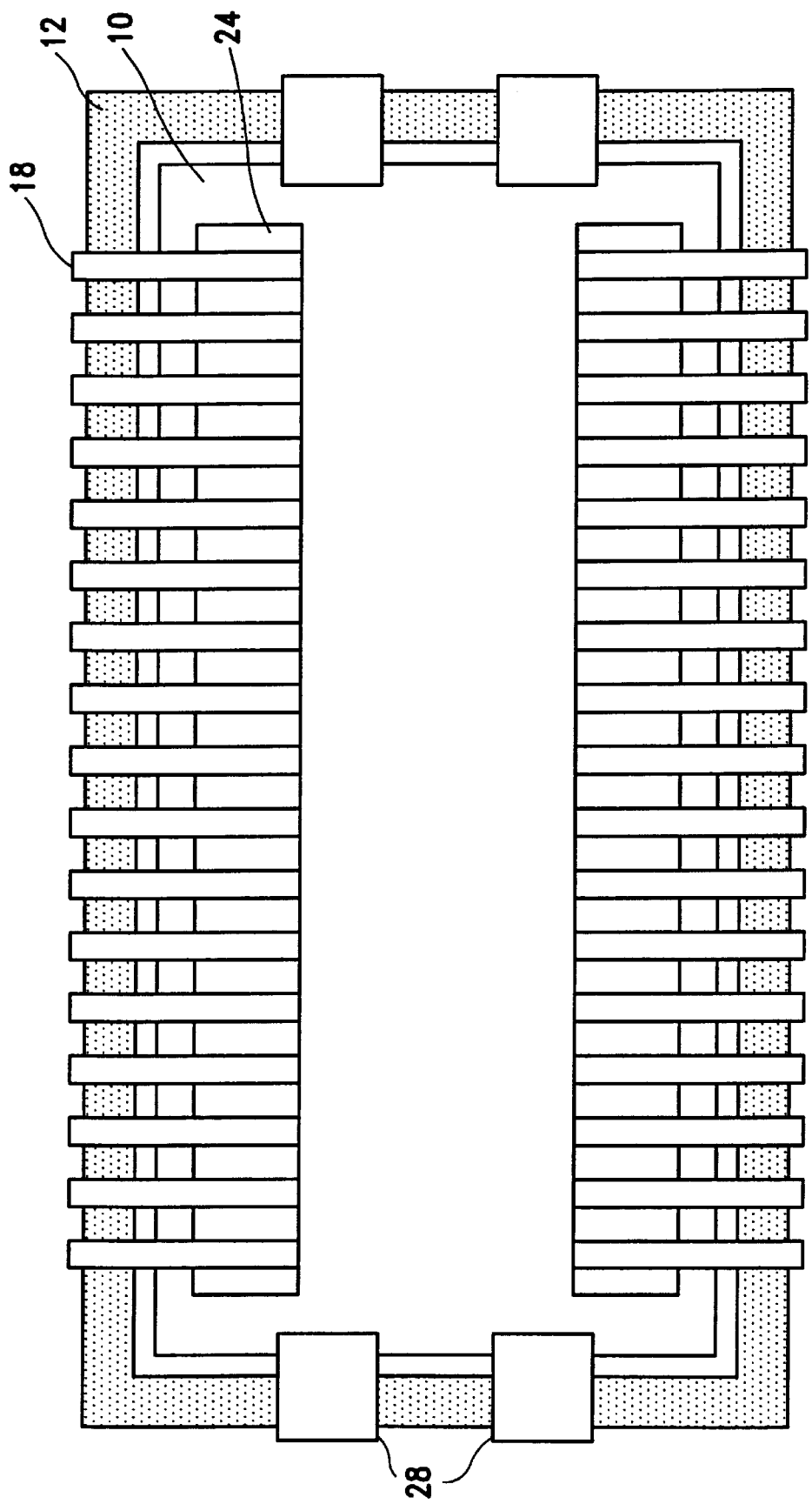
FIG. 3 is the bottom view of the electronic device package according to a first preferred embodiment of the present invention; first preferred embodiment of the present invention.

With reference now to FIGS. 1 to 3, a chip scale package for a chip 10 according to the first preferred embodiment of the present invention is disclosed. The chip 10 is enclosed by an outer frame 12 defining a predetermined gap 40 between the outer frame 12 and the chip 10. The outer frame 12 has electrically insulating surface 42. The outer frame 12 is preferably made of Al with oxidation treatment to form the aluminum oxide insulating surface 42.

The package further comprises a lead frame 13 with a plurality of inner leads 14 extending to the upper surface of the chip 10 to form an LOC (lead on chip) structure and a plurality of outer leads. The outer leads 18 enclose the outer surface of the outer frame 12, and each provides three planes for soldering, i.e., the upper, lateral and lower surface of the outer lead 18 as shown in FIG. 1. Each inner lead 14 and each outer lead 18 are linked by a slanting portion 16, which is functioned as a stress buffer means to adjust the height of the chip 10 when temperature is changed. The lead frame 13 is preferably made of copper or iron-nickel alloy.

The chip 10 is a semiconductor device with integrated circuit thereon and electrically connected to the inner lead 14 through a plurality of leads 20 formed by wire-bonding process, whereby the electrical signal of the chip 10 can be sent through the inner lead 14.

The chip 10 is encapsulated by a mold compound 22 to protect the leads 20. The mold compound 22 is preferably epoxy resin.

A buffer pad 24 is attached to the end of the outer lead 18 and sandwiched between the chip 10 and the outer lead 18 to function as buffer means therebetween.

A ground line 26 is connected to a wide ground outer lead 28, which has much wider cross section than that of the other outer leads 18 to provide better thermal conductance. The ground outer lead 28 facilitates the heat dissipation of the chip 10 when it is soldered to other device such as computer main board.

Figure 4:
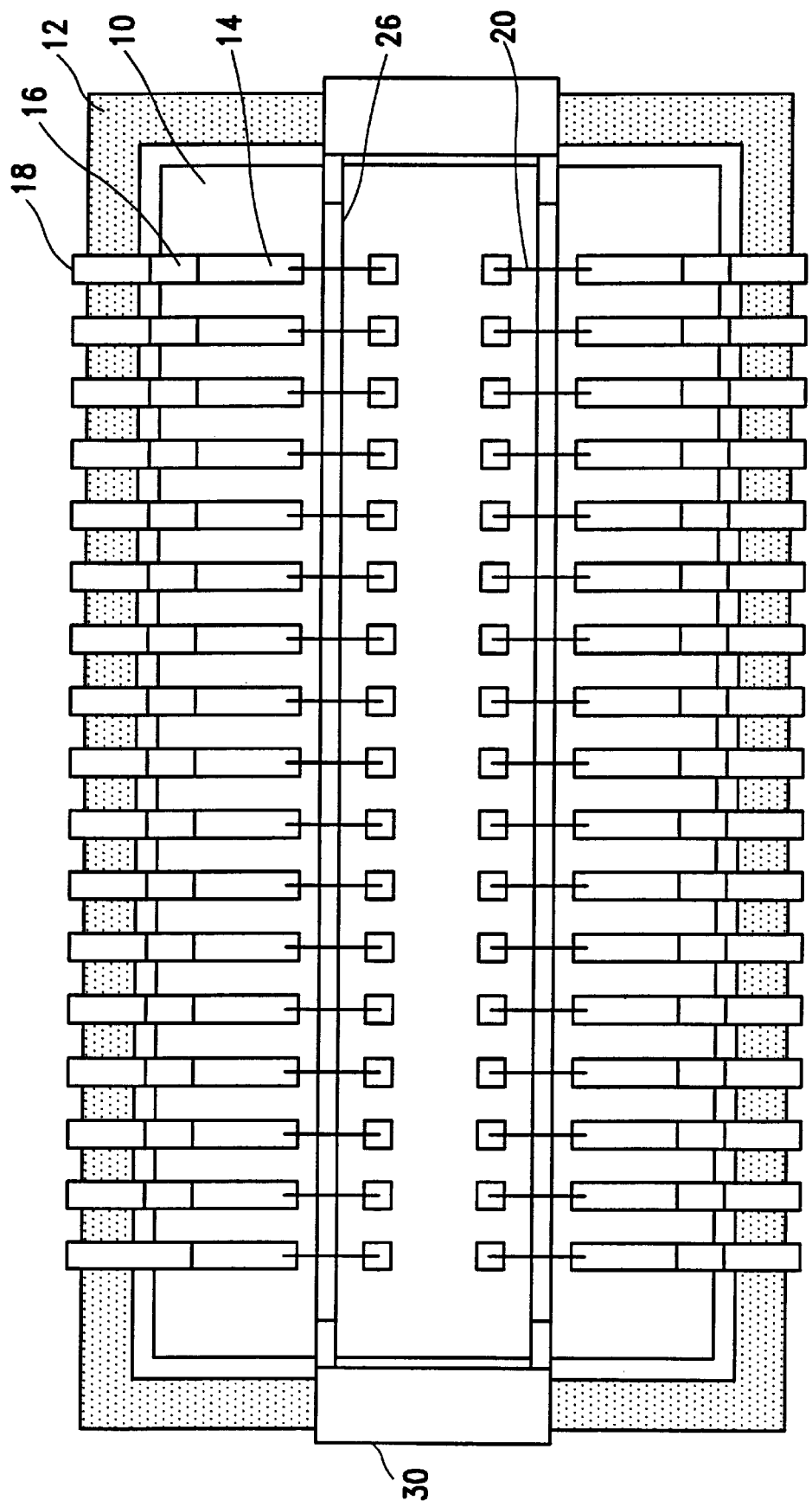
FIG. 4 is the top view of the electronic device package according to a second preferred embodiment of the present invention.
Figure 5:
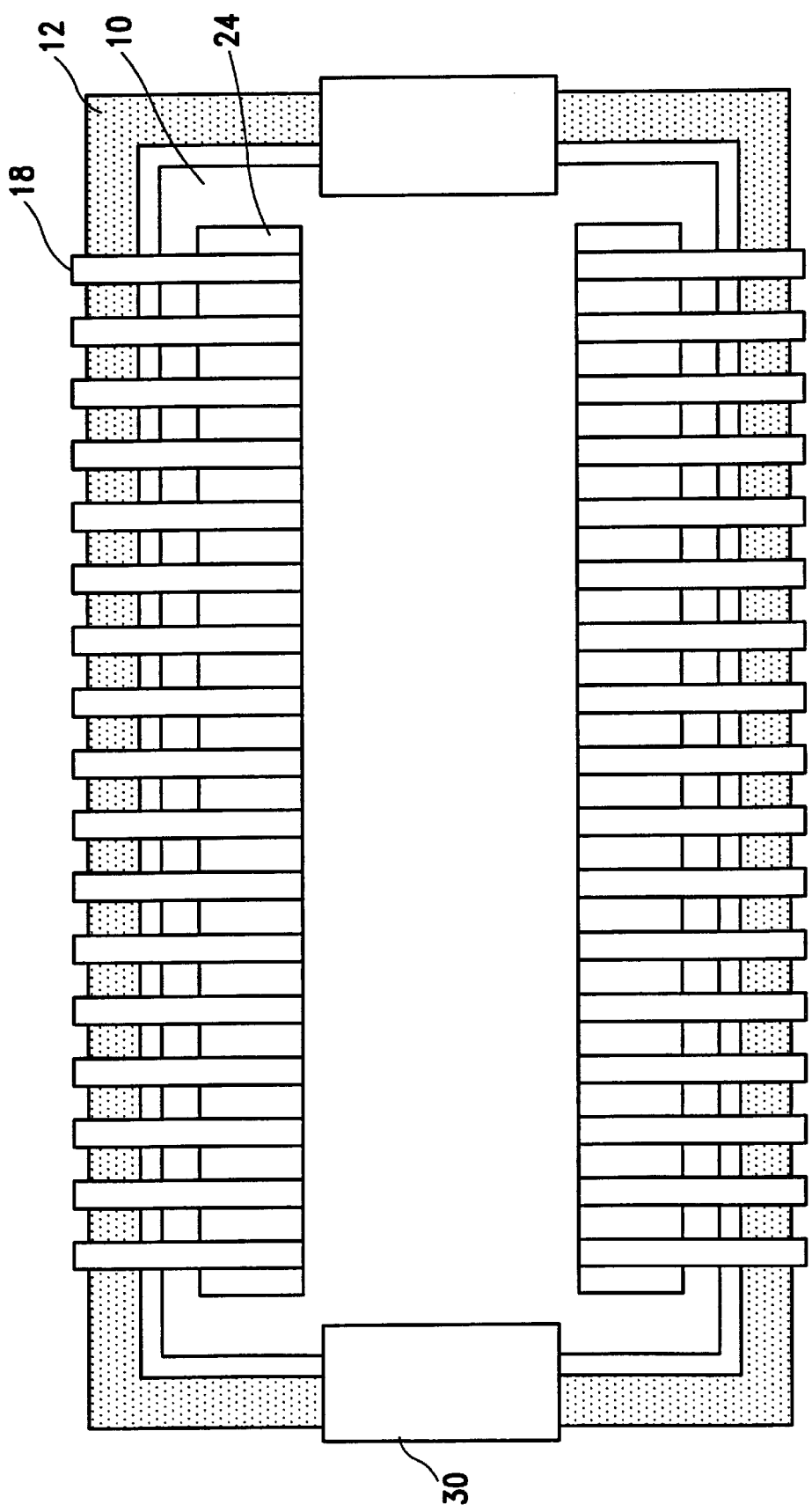
FIG. 5 is the bottom view of the electronic device package according to a second preferred embodiment of the present invention.

FIGS. 4 and 5 show the electronic device package according to a second preferred embodiment of the present invention. The package is similar to the first preferred embodiment except that two ground lines 26 are connected to a ground outer lead 30. The ground outer lead 30 has flat configuration with relatively larger cross section to enhance the heat dissipation of chip 10.

The above two preferred embodiments are exemplified with CSP wherein the ground outer lead with wide cross section is employed to conduct heat out of the package. However, it should be known that the present invention has various modifications to those of ordinary skill in the art. For example, the feature of the present invention can be applicable to chip on lead package or photoelectronic device.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. An electronic device package for facilitating heat dissipation of an electronic device, comprising:
   an outer frame having an insulating surface and enclosing said electronic device, said outer frame being displaced from said electronic device and defining a gap therebetween;
   a lead frame having a plurality of inner leads electrically connected to said electronic device, a plurality of outer leads surrounding the outer surface of said outer frame, a slanting portion linking said inner leads and said outer leads, said plurality of outer leads including at least one ground outer lead with a larger cross section area than said other outer leads.

2. The electronic device package as recited in claim 1, wherein said outer frame is formed of metal being surface treated to form said insulating surface.

3. The electronic device package as in claim 2, wherein said metal is aluminum.

4. The electronic device package as in claim 1, wherein said electronic device is a semiconductor chip.

5. The electronic device package as in claim 4, wherein a circuit on said electronic device is connected to said inner leads through a plurality of leads.

6. The electronic device package as in claim 4, wherein said inner leads are encapsulated by a mold compound.

7. The electronic device package as in claim 1, wherein said lead frame is made of copper.

8. The electronic device package as in claim 1, wherein said lead frame is made of iron-nickel alloy.

9. The electronic device package as in claim 1, further comprising a buffer pad on the end of at least one of said outer leads and sandwiched between said outer lead and said electronic device.

* * * * *